United States Patent
Yoshihara et al.

(10) Patent No.: US 8,923,074 B2
(45) Date of Patent: Dec. 30, 2014

(54) SEMICONDUCTOR MEMORY DEVICE

(75) Inventors: Masahiro Yoshihara, Yokohama (JP);
Naofumi Abiko, Kawasaki (JP);
Katsumi Abe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 251 days.

(21) Appl. No.: 13/432,465

(22) Filed: Mar. 28, 2012

(65) Prior Publication Data

US 2012/0250424 A1    Oct. 4, 2012

(30) Foreign Application Priority Data

Mar. 31, 2011 (JP) .................................. 2011-81156

(51) Int. Cl.
*G11C 7/10*    (2006.01)
(52) U.S. Cl.
CPC ............ *G11C 7/1006* (2013.01); *G11C 7/1087* (2013.01); *G11C 7/106* (2013.01)
USPC .................. 365/189.05; 365/189.18
(58) Field of Classification Search
CPC ....... G11C 7/106; G11C 16/24; G11C 7/1087
USPC ........................ 365/189.05, 189.18
See application file for complete search history.

(56) References Cited

U.S. PATENT DOCUMENTS

| | | | |
|---|---|---|---|
| 7,161,867 B2 | 1/2007 | Kaku | |
| 7,379,333 B2 | 5/2008 | Lee et al. | |
| 7,405,985 B2* | 7/2008 | Cernea et al. | 365/200 |
| 7,408,814 B2* | 8/2008 | Vali et al. | 365/189.05 |
| 2009/0268521 A1 | 10/2009 | Ueno et al. | |
| 2011/0141814 A1 | 6/2011 | Abiko | |

FOREIGN PATENT DOCUMENTS

| | | |
|---|---|---|
| JP | 2000-48558 | 2/2000 |
| JP | 2009/266349 | 11/2009 |

OTHER PUBLICATIONS

Office Action issued Apr. 2, 2013, in Japanese Patent Application No. 2011-081156 with English translation.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A sense amplifier circuit is connected to a bit-line and senses and amplifies a signal read from a memory cell. A first data latch is connected to a sense amplifier via a first bus. A second data latch is connected to a second bus. A plurality of circuit groups are repeatedly provided in a first direction, each circuit group including one sense amplifier circuit and one first data latch. The second data latch is provided between the circuit groups and an input/output buffer.

17 Claims, 6 Drawing Sheets

Data Bass Consumption Current: 8(set) × C × 2(Both Side) = 16C

Data Bass Consumption Current: 16(set) × 2C × 1(One Side) = 32C

Data Bass Consumption Current
: 16(set) × 1/8C × 1(One Side) = 2C(Local Bus only)

SEMICONDUCTOR MEMORY DEVICE

CROSS REFERENCE TO RELATED APPLICATIONS

This application is based on and claims the benefit of priority from prior Japanese Patent Application No. 2011-81156, filed on Mar. 31, 2011, the entire contents of which are incorporated herein by reference.

FIELD

The embodiments described herein relate to a semiconductor memory device.

BACKGROUND

A NAND flash memory includes a cell array. The cell array includes an array of NAND cell units. Each NAND cell unit includes a plurality of memory cells connected in series. The ends of each NAND cell unit are connected to a bit-line and a source-line via select gate transistors, respectively.

In each NAND cell unit, the control gates of the memory cells are connected to different word-lines. In the NAND flash memory, a plurality of memory cells are connected in series and share sources and drains. The memory cells also share select gate transistors and their bit-line contacts and source-line contacts. The unit memory cell can thus have a smaller size. The word-line and the memory cell's element region each have a shape close to a simple stripe pattern. The NAND flash memory can thus easily be made more compact. Therefore, the NAND flash memory provides a large capacity flash memory.

As the memory cells become smaller, the number of memory cells included in one memory cell array increases. In proportion to this, the circuit area of the sense amplifier unit also increases, for example. The increase of the circuit area of the peripheral circuits results in the increase of the length of the bus wiring in the sense amplifier unit. Repeatedly passing a current through the bus wiring of a longer length results in the increase of the power consumption.

DETAILED DESCRIPTION

Figure 1:
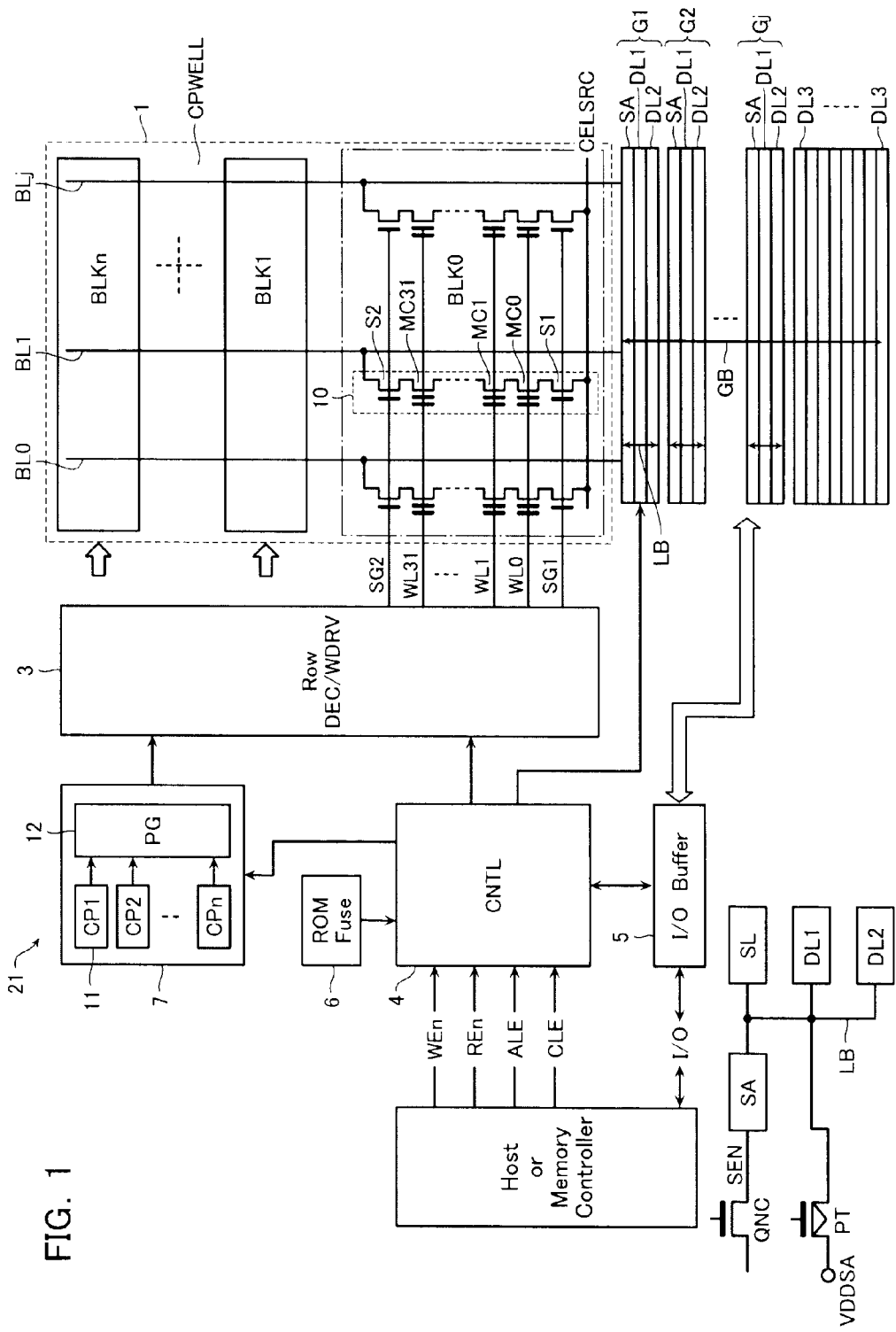
FIG. 1 is a block diagram of the entire configuration of a semiconductor memory device according to an embodiment.
Figure 2:
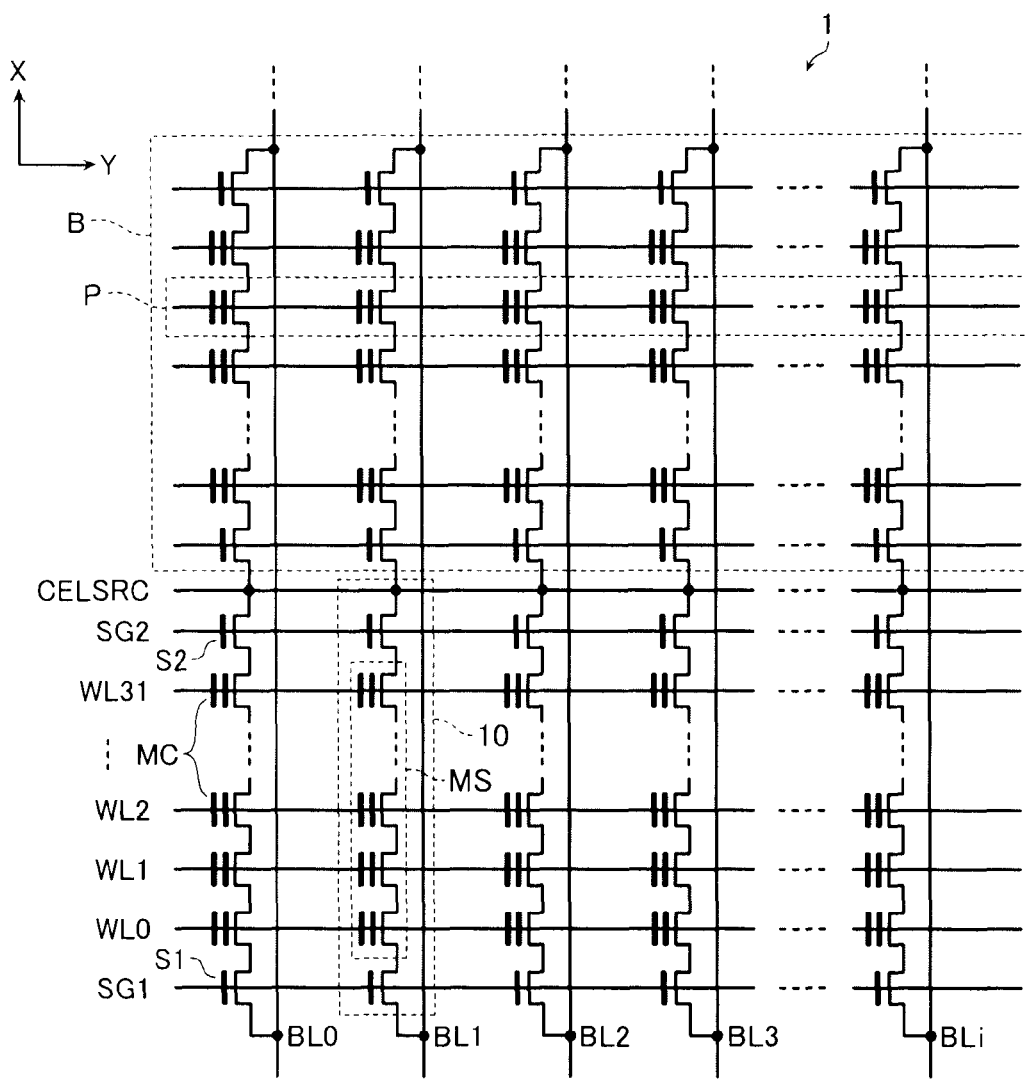
FIG. 2 is an equivalent circuit diagram of the configuration of the memory cell array 1 in FIG. 1.

A semiconductor memory device according to the embodiments includes a memory cell array, the memory cell array including a memory cell arranged therein, the memory cell storing data in a non-volatile manner. A bit-line is arranged in the memory cell array, extending in the first direction. The bit-line supplies a signal to the memory cell or reads a signal from it. A sense amplifier circuit is connected to the bit-line. The sense amplifier circuit senses and amplifies a signal read from the memory cell. The sense amplifier is connected to a first data latch via a first bus. A second data latch is connected to a second bus. An input/output buffer is provided to input/output data from/to the outside. A plurality of circuit groups are repeatedly provided in the first direction, each group including one sense amplifier circuit and one first data latch. The second data latch is provided between the circuit groups and a peripheral circuit for inputting/outputting data from/to the outside.

The embodiments of the present invention will now be described in more detail referring to the drawings.

FIG. 1 shows a schematic configuration of the NAND flash memory 21 according to an embodiment. With reference to FIG. 1, the NAND flash memory 21 includes a memory cell array 1, a sense amplifier circuit SA, data latch circuits DL1 to DL3, a row decoder 3, a controller 4, an input/output buffer 5, a ROM fuse 6, and a voltage generation circuit 7. The controller 4 forms a control portion for the memory cell array 1.

The memory cell array 1 includes NAND cell units MU 10 arranged in a matrix. One NAND cell unit 10 includes a plurality of memory cells MC connected in series and select gate transistors S1 and S2 connected to the respective ends of the series.

One memory cell MC includes, as is well known, a drain, a source, and a gate-insulating film (a tunnel insulating film) formed therebetween. The memory cell MC also includes, on the gate-insulating film, a charge accumulation layer, an inter-dielectric film, and a control gate electrode in this order. The control gate is connected to one of word-lines.

The select gate transistor S1 has a source connected to a common source-line CELSRC. The select gate transistor S2 has a drain connected to a bit-line BL.

In each NAND cell unit 10, the control gates of the memory cells MC are connected to different word-lines WL (WL0, WL1, . . . , and WL31). The gates of the select gate transistors S1 and S2 are connected to respective select gate lines SG1 and SG2 running in parallel with the word-lines WL. A set of memory cells sharing one word-line form one or two pages. A set of NAND cell units 10 sharing the word-lines WL and the select gate lines SG1 and SG2 forms a block BLK as a unit of data erase.

With reference to FIG. 1, the memory cell array 1 includes a plurality of blocks BLK (BLK0, BLK1, . . . , and BLKn) in the bit-line BL direction. The memory cell array 1 including these blocks is formed in one cell well (CPWELL) in a silicon substrate.

The bit-lines BL of the memory cell array 1 are connected to a plurality of sense amplifier circuits SA, respectively. Each sense amplifier circuit SA senses read data and holds write data. The row decoder (including a word-line driver) 3 selectively drives the word-lines WL and the select gate lines SG1 and SG2.

The data input/output buffer 5 gives and receives data between the data latch circuits LA2 to LA3 and an external input/output terminal (e.g, memory controller or HOST). The buffer 5 also receives command data and address data. The control circuit 4 receives external control signals such as a write enable signal WEn, a read enable signal REn, an address latch enable signal ALE, and a command latch enable signal CLE, and controls the overall memory operation.

Specifically, the control circuit 4 includes a command interface and an address hold/transfer circuit, and determines whether supplied data is write data or address data. In response to the determination, write data is transferred to the sense amplifier circuit SA and address data is transferred to the row decoder 3 and the sense amplifier circuit SA.

According to the external control signals, the control circuit 4 also controls the sequence of read and write/erase, an applied voltage, and the like.

The voltage generation circuit 7 includes a plurality of booster circuits 11 and a pulse generation circuit 12. Each booster circuit 11 includes a well-known charge pump circuit. According to control signals from the controller 4, the voltage generation circuit 7 switches the number of driven booster circuits 11, and controls the pulse generation circuit 12 to generate the desired pulse voltage.

In the memory cell array 1, the memory cells MC along j bit-lines BL (for example, j=16) form one column. Each column has sense amplifier circuits SA whose number corresponds to the number j of bit-lines BL. If the All Bit Line scheme (ABL) is adopted in which a plurality of bit-lines BL1 to BLj in one column are to be read at the same time, j sense amplifier circuits SA are provided in response to the number j of bit-lines BL. An example where the ABL scheme is adopted will be described below. Note that the sense amplifier circuit SA includes an arithmetic circuit therein. This will be described below in more detail.

It should be appreciated that the present invention is not limited to the ABL scheme. For example, if the Even/Odd method is adopted in which an odd bit-line and an even bit-line are alternately read, the number of sense amplifier circuits SA may be half the number j of bit-lines BL. The same scheme may still be adopted.

If the ABL scheme is adopted, the data latch circuits DL1 and DL2 also include, in response to the number j of bit-lines BL in each column, j data latch circuits DL1 and j data latch circuits DL2, respectively, in each column.

In this embodiment, circuit groups Gi (i=1 to j), each including one sense amplifier circuit SA, one data latch circuit DL1, and one data latch circuit DL2, are repeatedly formed in the longitudinal direction (the column direction) of the bit-lines BL. One circuit group Gi is provided for each bit-line BLi. The two data latch circuits DL1 and DL2 are provided for each bit BL to allow each memory cell MC to store two-bit data (2 bit/cell). The sense amplifier circuit SA is connected, via a local bus LB, to a sense latch circuit SL and the data latch circuits DL1 and DL2. The circuits SL, DL1, and DL2 form a part of the sense amplifier circuit SA. Note that if each memory cell MC stores 1-bit data, the data latch circuit DL2 may be omitted. Moreover, if each memory cell MC stores 3-bit data, an additional data latch circuit may be provided in addition to the data latch circuits DL1 and DL2.

The local bus LB is connected to the first end of a p-type charging transistor PT. The second end of the charging transistor PT is connected to a high potential VDDSA. The charging transistor PT may be turned on to charge the local bus LB.

The data latch circuit DL3 is a data latch circuit used as the so-called data cache. The circuit DL3 has a function of temporarily storing data supplied from the input/output buffer 5. In performing the ABL scheme, j data latch circuits DL3 are provided in one column, for example, corresponding to j pieces of bit-lines BL. The data latch circuit DL3 is formed in a more distant position from the memory cell array 1 than the above circuit group Gi is formed. In other words, the circuit group Gi is provided between the memory cell array 1 and the data latch circuit DL3 (refer to FIG. 5). Further in other words, the circuit group Gi and the data latch circuit DL3 are provided between the memory cell array 1 and input/output buffer 5 (or data pads to transfer data between the NAND flash memory 21 and memory controller or Host) (refer to FIG. 5).

In one circuit group Gi, the sense amplifier circuit SA, the data latch circuit DL1, and the data latch circuit DL2 are connected to one another by the local bus LB, and they transfer data with one another via the local bus LB.

The circuit groups Gi and the data latch circuit DL3 are connected via a global bus GB different from the local bus LB. The circuit groups Gi and the data latch circuit CL3 transfer data with each other via the global bus GB.

The effects of this embodiment will now be described in comparison with the comparative examples in FIG. 3 and FIG. 4.

Figure 3:
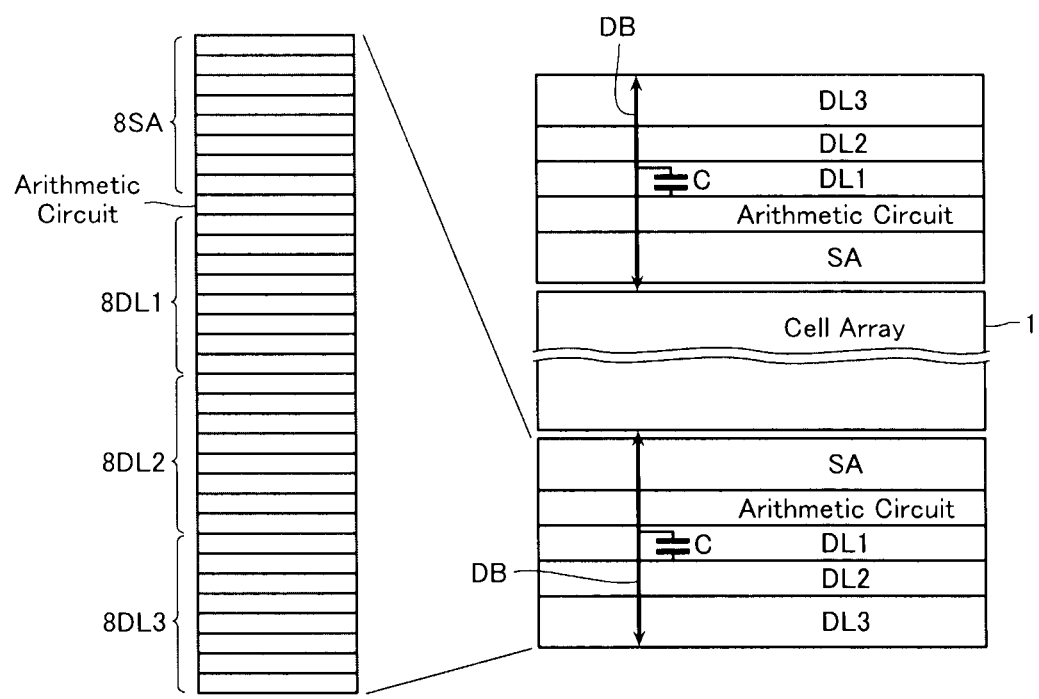
FIG. 3 shows a comparative example of the embodiment.

First, FIG. 3 shows a first comparative example. In this comparative example, the memory cell array 1 includes, on the both sides thereof in the column direction, the sense amplifier circuit SA, the arithmetic circuit, the data latch circuit DL1, the data latch circuit DL2, and the data latch circuit DL3.

In this embodiment, corresponding to j bit-lines BL included in one column, for example, j/2 sense amplifier circuits SA are repeatedly formed on one side of the memory cell array 1, adjacent to which the arithmetic circuit, j/2 data latch circuits DL1, j/2 data latch circuits DL2, and j/2 data latch circuits DL3 are then provided. These circuits are connected to one another via the data bus DB. The circuits transfer data with one another via the data bus DB to perform various arithmetic operations for the write and read in the arithmetic circuit. Data transfer for data write, data read, and the like are performed by the data bus DB.

If j=16, j being the number of bit-lines BL included in one column, the memory cell array 1 has, on one side thereof, 8 sense amplifier circuits SA, the arithmetic circuit, 8 data latch circuits DL1, 8 data latch circuits DL2, and 8 data latch circuits DL3.

If, in the first comparative example, one data bus DB has a capacity of C, for example, the current consumption of the data bus DB increases in proportion to $8 \times C \times 2 = 16C$.

Figure 4:
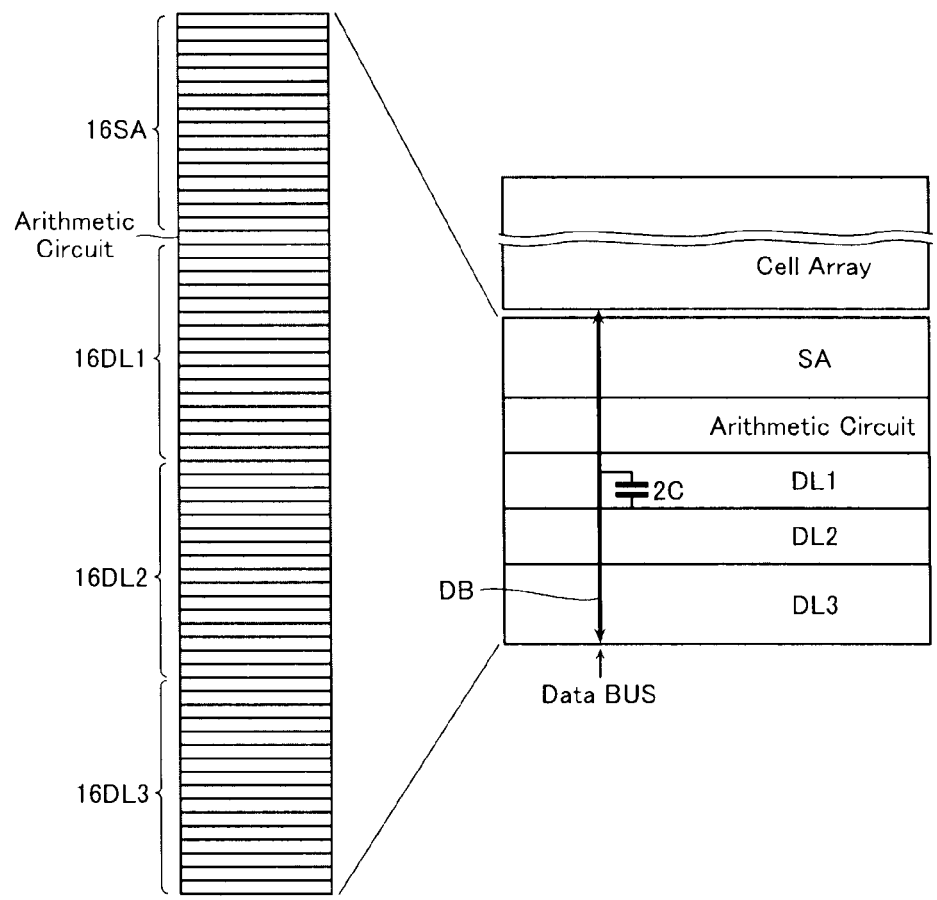
FIG. 4 shows a comparative example of the embodiment.

FIG. 4 shows a second comparative example. In the second comparative example, the memory cell array 1 has, on only one side thereof in the column direction, j=16 sense amplifier circuits SA, the arithmetic circuit, 16 data latch circuits DL1, 16 data latch circuits DL2, and 16 data latch circuits DL3, for example.

In this embodiment, j=16 pieces of sense amplifier circuits SA are repeatedly formed, for example, for one column. Adjacent to the sense amplifier circuits SA, 16 data latch circuits DL1, 16 data latch circuits DL2, and 16 data latch circuits DL3 are then provided, for example. These circuits transfer data with one another via the data bus DB, and the arithmetic circuit performs the arithmetic operations.

In the second comparative example, because the memory cell array 1 has, on only one side thereof, the sense amplifier circuit SA and the data latch circuits DL1 to DL 3, the peripheral circuits may have simplified circuitry.

In the second comparative example, however, one data-bus DB has a capacity (2C) twice the capacity of one data-bus DB in the first comparative example. Therefore, the current consumption in the data bus DB increases in proportion to $16 \times 2C = 32C$. In other words, the current consumption in the data bus DB is twice that in the first comparative example in a simple calculation.

Figure 5:
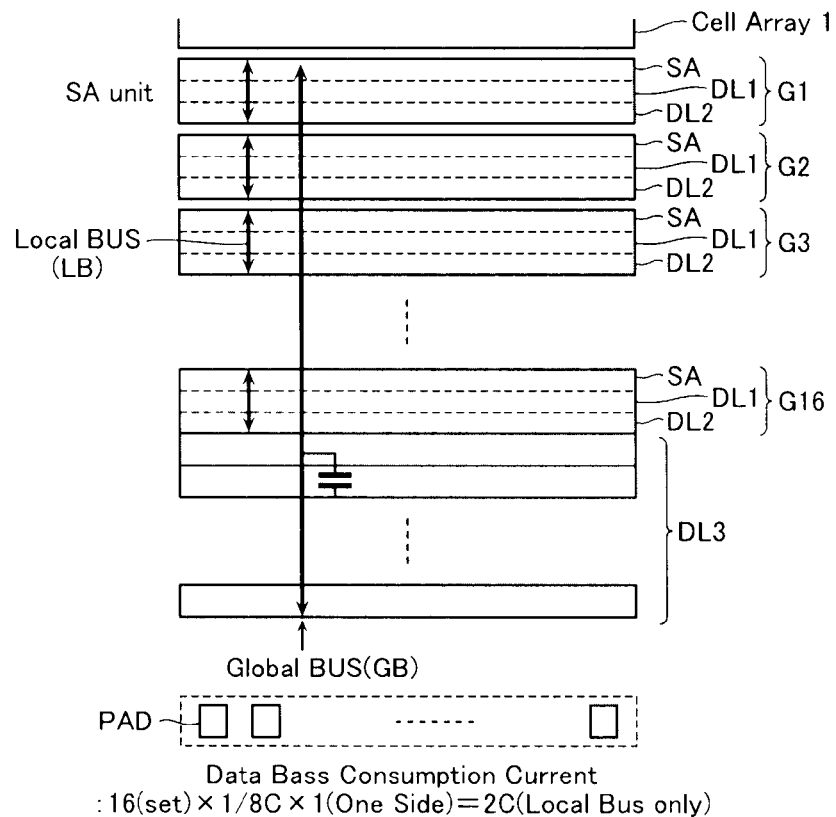
FIG. 5 shows an effect of the embodiment.

In this embodiment, with reference to FIG. 5, the sense amplifier circuit SA itself includes the arithmetic circuit therein, and the arithmetic operations for the data write and data read are complete in the sense amplifier circuit SA and the data latch circuits DL1 and DL2 (in the circuit group Gi), which are connected via the local bus LB. The global bus GB is used only in a few cases such as when write data is first transferred from the data latch circuit DL3 to the circuit group Gi, and when read data after the arithmetic operations are complete is transferred from the circuit group Gi to the data latch circuit DL3.

One local bus LB has a capacity of about ⅛C, where C is the capacity of the data bus DB in the first comparative example. Therefore, the current consumption only in the local bus LB is ⅛C×16=2C. Therefore, the current consumption may be ⅛ compared to that in the first comparative example in a simple calculation.

Figure 6:
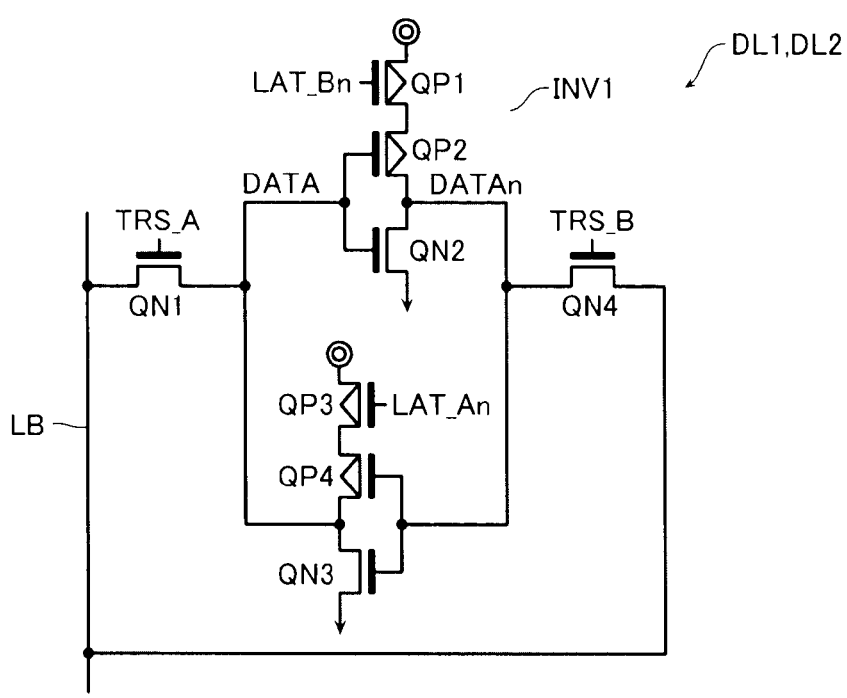
FIG. 6 is an equivalent circuit diagram of an example configuration of the data latch circuits DL1 and DL2 in FIG. 1.

FIG. 6 shows an example configuration of the data latch circuits DL1 and DL2 according to this embodiment. The data latch circuits DL1 and DL2 each include inverters INV1 and INV2 and transfer gate transistors QN1 and QN4. The inverters INV1 and INV2 are cross-connected with each other to form a latch circuit. The inverter INV1 includes PMOS transistors QP1 and QP2 and an NMOS transistor QN2 connected in series. The inverter INV2 includes PMOS transistors QP3 and QP4 and an NMOS transistor QN3 connected in series.

The gate of the PMOS transistor QP2 and the gate of the NMOS transistor QN2 are commonly connected to form the input terminal of the inverter INV1. The drain of the PMOS transistor QP2 and the drain of the NMOS transistor QN2, which are commonly connected, form the output terminal of the inverter INV1. The gate of the PMOS transistor QP4 and the gate of the NMOS transistor QN3 are commonly connected to form the input terminal of the inverter INV2. The drain of the PMOS transistor QP4 and the drain of the NMOS transistor QN3, which are commonly connected, form the output terminal of the inverter INV2. The PMOS transistors QP1 and QP3 are switches to activate the respective inverters INV1 and INV2. The transistors QP1 and QP3 are switched to the conductive state by being provided with respective signals LAT_Bn and LAT_An.

Between the local bus LB and the input terminal of the inverter INV1 (the output terminal of the inverter INV2), the transfer gate transistor QN1 is connected. The gate of the transfer gate transistor QN1 is supplied with a signal TRS_A. Between the local bus LB and the output terminal of the inverter INV1 (the input terminal of the inverter INV2), the transfer gate transistor QN4 is connected. The gate of the transfer gate transistor QN4 is supplied with a signal TRS_B.

With reference to FIG. 6, the data latch circuits DL1 and DL2 each include only 8 transistors. The transfer transistors QN1 and QN2 are NMOS transistors. Thus, the power supply voltage VDD cannot be transferred to the input terminal (the node DATA) of the inverter INV1 via the transfer gate transistor QN1. Instead, the ground voltage Vss may be supplied from the local bus LB to the input terminal (node DATAn) of the inverter INV2 via the transfer gate transistor QN4, thereby supplying the power supply voltage VDD to the node DATA.

Figure 7:
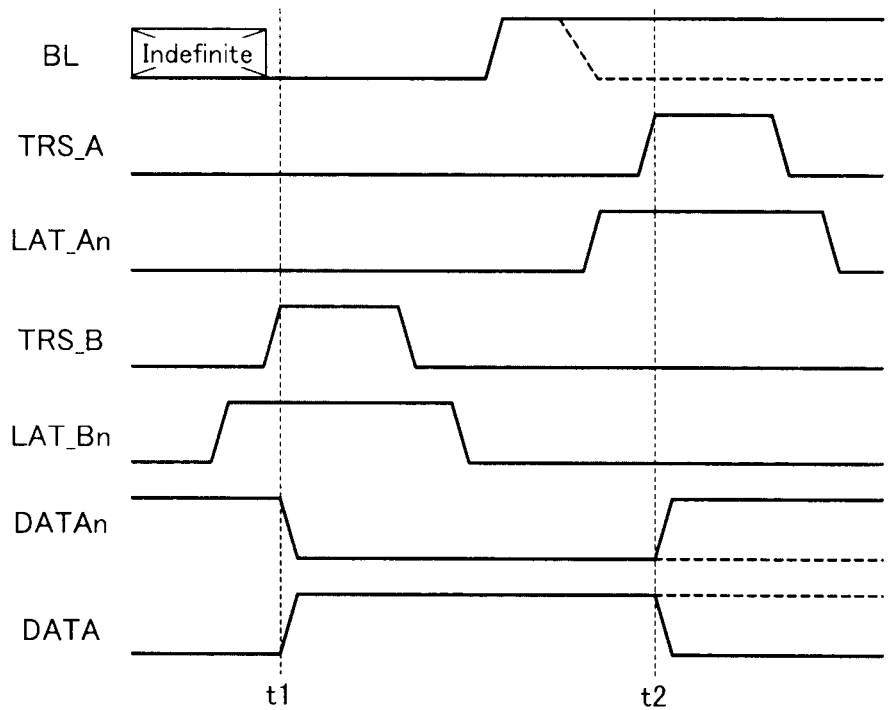
FIG. 7 is a timing diagram of the operation of the data latch circuits DL1 and DL2 in FIG. 6.

With reference to the timing diagram in FIG. 7, a description is now given of the operation of inputting data "H" from the local bus LB to the node DATA.

First, the local bus LB in which the initial state is indefinite is discharged to 0 V. After the local bus LB is sufficiently discharged, the signal LAT_Bn is raised to "H" (the power supply voltage VDD) to change the PMOS transistor QP1 to the non-conductive state. Then, the control signal TRS_B is raised to "H" to switch the NMOS transistor QN4 to the conductive state, thereby connecting the node DATAn to the local bus LB to discharge the node DATAn to 0 V. Thus, the node DATA is charged to the "H" level via the inverter INV2.

Then, the control signals TRS_B and LAT_Bn are sequentially lowered to "L" (0 V). Then, the local bus LB starts to be charged to the power supply voltage VDD. Then, according to data to be provided to the data latch circuit DL1 or DL2, data "1" or data "0" is output to the local bus LB.

In this condition, at time t2, the control signals LAT_An and TRS_A are sequentially raised to "H," thereby applying the voltage (VDD or 0 V) of the local bus LB to the node DATA via the NMOS transistor QN1. Further, the node DATAn is provided with the state of inverted node DATA.

The data latch circuits DL1 and DL2 in FIG. 6 may also be used as inverters (for NOT operations). For example, if the node DATA is at the "H" level, the node DATAn is at the "L" level. In other words, after data "0" is input from the local bus LB to the node DATA via the transistor QN1, data "1" held in the node DATAn is output to the local bus LB via the transistor QN4. As a result, the data latch circuits DL1 and DL2 may be used as inverter circuits, thereby reducing the circuit area.

Figure 8:
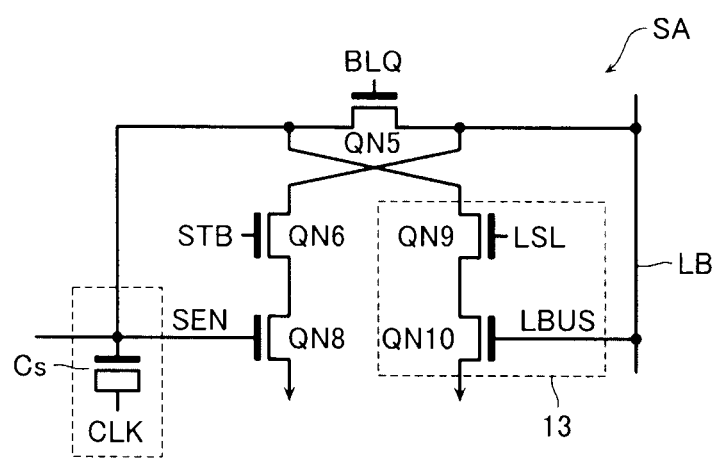
FIG. 8 is an equivalent circuit diagram of an example configuration of the sense amplifier circuit SA in FIG. 1.

FIG. 8 shows an example configuration of the sense amplifier circuit SA. The sense amplifier circuit SA includes a sense capacitor Cs and NMOS transistors QN5 to QN10. The transistors QN9 and QN10 form an arithmetic circuit 13.

With reference to FIG. 8, the sense node SEN is connected to the bit-line BL via a not-shown clamp transistor. Between the sense node SEN and the local bus LB, the NMOS transistor QN5 is connected. The NMOS transistor QN5 is conduction controlled by a signal BLQ and is used in the arithmetic operations. The NMOS transistor QN5 serves to pull the potential of the local bus LB depending on the state of the sense node SEN or to pull the potential of the sense node SEN depending on the state of the local bus LB.

The NMOS transistors QN6 and QN8 are connected in series between the local bus LB and the ground terminal. The NMOS transistor QN6 is conduction controlled according to a strobe signal STB. In the sense operation, the strobe signal STB is raised to the "H" level, thereby changing the NMOS transistor QN6 to the conductive state. In this condition, whether or not the potential of the sense node SEN decreases determines stored data in the memory cell MC. If the memory cell MC is not rendered conductive and thus the potential of the sense node SEN is kept at the voltage after the precharge, the NMOS transistor QN8 is in the conductive state and thus the potential of the local bus LB is reduced. Conversely, if the memory cell MC is rendered conductive and thus the potential of the sense node SEN is reduced, the NMOS transistor QN8 is in the non-conductive state and thus the potential of the local bus LB remains high.

The potential level of the local bus LB determines whether or not the NMOS transistor QN10 is rendered conductive. The NMOS transistor QN9 is conduction controlled by a signal LSL. If the NMOS transistor QN9 is changed to the conductive state, data stored at the local bus LB is transferred to the sense node SEN as appropriate. In this way, the arithmetic circuit 13 functions as an arithmetic circuit in performing, for example, a storage scheme of two-bit/cell.

A description is now given of a method of arithmetically operating, using the sense amplifier circuit SA, data (D1) of the data latch circuit DL1 and data (D2) of the data latch circuit DL2. The circuits D1 and D2 are connected to the local bus LB.

First, the OR operation of data (D1) and data (D2) will be described.

First, the gate of the charging transistor PT connected to the local bus LB is turned on to charge the local bus LB and, at the same time, the signal BLQ level is raised to "H" to precharge the sense node SEN to the "H" level.

Then, after data (D1) is output to the local bus LB, the signal LSL is raised to the "H" level. In so doing, if the local bus LB is "H," the potential of the sense node SEN is pulled, thus lowering the sense node SEN to the "L" level. If the local bus LB is at the "L" level, the potential of the sense node SEN is not pulled even if the signal LSL is at the "H" level, thus maintaining the sense node SEN at the "H" level. As a result, inverted data (/D1) of data (D1) is stored in the sense node SEN.

Then, after the signal BLQ is lowered to the "L" level, the local bus LB is recharged by the charging transistor PT and then data (D2) is output to the local bus LB. Then, the signal LSL is raised to the "H" level. In so doing, if the local bus LB is at the "H" level, the potential of the sense node SEN is pulled, thereby providing the "L" level. If the local bus LB is at the "L" level, the potential of the sense node SEN is not pulled, thereby maintaining the "H" level. Note that if the sense node SEN is at the "L" level, the "L" level is maintained regardless of the level of the local bus LB. In other words, if either of data (D1) and data (D2) is at the "H" level, the sense node SEN is at the "L" level. Specifically, the NOR operation result of data (D1) and data (D2) is output to the local bus LB.

Then, after the signal LSL is lowered to the "L" level, the signal STB is raised to the "H" level, thereby outputting data of the sense node SEN to the local bus LB. Here, because the potential of the local bus LB is pulled if the sense node SEN is at the "H" level, whereas the potential maintains the state if the sense node SEN is at the "L" level, data at the sense node SEN is logical inverse of that at the local bus LB. In other words, the result output to the local bus LB is the OR operation result of data (D1) and data (D2). The result may be incorporated into either of the data latch circuit DL1 and the data latch circuit DL2 to provide the desired results.

A method of performing the AND operation of data (D1) and data (D2) will be now described.

The AND operation may be expressed in the OR operation according to the De Morgan's theorem: A·B=~(~A+~B).

Specifically, the transistor QN4 is turned on to output the inversion of data (D1) to the local bus LB to raise the signal LSL to the "H" level. Similarly, the transistor QN4 is turned on to output the inverted data of data (D2) to the local bus LB to raise the signal LSL to the "H" level.

In so doing, if either of data (D1) and data (D2) is at the "L" level, the state of the local bus LB is at the "H" level of inverted data and thus the potential of the sense node SEN is pulled to the "L" level.

The result may be considered as the NAND operation result of data (D1) and data (D2). Then, the strobe signal STB is raised to the "H" level to output the AND operation result of data (D1) and data (D2) to the local bus LB. The result may be incorporated into either of the data latch circuit DL1 and the data latch circuit DL2 to provide the desired results.

As described above, a data latch having an inversion function as shown in FIG. 6 and a sense amplifier circuit as shown in FIG. 8 may be used to perform all logic operations. As a result, an additional arithmetic circuit may not be needed, thereby reducing the circuit area of the sense amplifier circuit.

As described above, data may be transferred between the sense amplifier and the data latches (DL1 and DL2) via the local bus LB of a short length in the data operation or the like. This allow for a reduced operating time and limited charge and discharge currents through the data bus.

The data caches DL3 may be collectively disposed on the input/output buffer 5 side seen from the memory cell array 1, for example, thereby improving the speed of the serial data transfer with the outside. Even for the data caches DL3 collectively disposed as described above, data may be transferred between the sense amplifier and the data latches (DL1 and DL2) via the local bus LB of a short length, thus limiting the power consumption.

As described above, data is transferred between the data cache DL3 and the circuit group Gi via the global bus GB. The number of data transfers may be designed as small as possible by introducing the above local bus transfer.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A semiconductor memory device comprising:
a memory cell array including a memory cell storing data in a non-volatile manner;
a bit-line arranged in the memory cell array extending in a first direction, the bit-line supplying or reading a signal to/from the memory cell;
a sense amplifier circuit connected to the bit-line, the sense amplifier circuit sensing and amplifying a signal read from the memory cell;
a first data latch connected to the sense amplifier via a first bus;
a second data latch connected to a second bus; and
an input/output buffer inputting/outputting data from/to the outside,
a plurality of circuit groups being repeatedly provided in the first direction, each circuit group including one sense amplifier circuit and one first data latch,
the second data latch being provided between the circuit groups and the input/output buffer, and
a length of the first data bus is shorter than a length of the second data bus.

2. The semiconductor memory device according to claim 1, wherein
the second bus is wired to connect the circuit groups and the second data latch.

3. The semiconductor memory device according to claim 2, wherein
the memory cell array including a plurality of columns,
the circuit groups are repeatedly provided, for each column, by a number j of bit-lines included in the column, and
j pieces of second data latches are provided for one column.

4. The semiconductor memory device according to claim 3, wherein
the first data latch comprises:
a latch circuit including a first inverter and a second inverter, the second inverter being cross-connected with the first inverter;
a first transfer transistor connected between the first bus and an input terminal of the first inverter; and
a second transfer transistor connected between the first bus and an input terminal of the second inverter.

5. The semiconductor memory device according to claim 4, wherein
the sense amplifier circuit comprises:
a first transistor set at a conductive state or a non-conductive state based on a state of a sense node to switch a potential of the first bus; and
a second transistor having a gate connected to the first bus, the second transistor being switched between a conductive state and a non-conductive state.

6. The semiconductor memory device according to claim 1, wherein
the memory cell array comprises a plurality of columns,
the circuit groups are repeatedly provided, for each column, by a number j of bit-lines included in the column, and
j pieces of second data latches are provided for one column.

7. The semiconductor memory device according to claim 6, wherein
the first data latch comprises:
a latch circuit comprising a first inverter and a second inverter, the second inverter being cross-connected with the first inverter;
a first transfer transistor connected between the first bus and an input terminal of the first inverter; and
a second transfer transistor connected between the first bus and an input terminal of the second inverter.

8. The semiconductor memory device according to claim 7, wherein
the sense amplifier circuit comprises:
a first transistor set at a conductive state or a non-conductive state based on a state of a sense node to switch a potential of the first bus; and
a second transistor having a gate connected to the first bus, the second transistor being switched between a conductive state and a non-conductive state.

9. The semiconductor memory device according to claim 1, wherein
the first data latch comprises:
a latch circuit comprising a first inverter and a second inverter, the second inverter being cross-connected with the first inverter;
a first transfer transistor connected between the first bus and an input terminal of the first inverter; and
a second transfer transistor connected between the first bus and an input terminal of the second inverter.

10. The semiconductor memory device according to claim 9, wherein
the sense amplifier circuit comprises:
a first transistor set at a conductive state or a non-conductive state based on a state of a sense node to switch a potential of the first bus; and
a second transistor having a gate connected to the first bus, the second transistor being switched between a conductive state and a non-conductive state.

11. A semiconductor memory device comprising:
a memory cell array comprising a memory cell storing data;
a bit-line arranged in the memory cell array extending in a first direction;
a plurality of circuit groups provided between the memory cell array and a pad, each circuit group including one sense amplifier circuit connected to the bit-line and one first data latch connected to the sense amplifier via a first bus, and at least two circuit groups repeatedly provided in the first direction;
a second data latch connected to a second bus; and
the second data latch being connected to the circuit groups via the second bus, and
a length of the first data bus is shorter than a length of the second data bus.

12. The semiconductor memory device according to claim 11, wherein
the memory cell array includes a plurality of columns,
the circuit groups are repeatedly provided, for each column, by a number j of bit-lines included in the column, and
j pieces of second data latches are provided per one column.

13. The semiconductor memory device according to claim 12, wherein
the first data latch comprises:
a latch circuit comprising a first inverter and a second inverter, the second inverter being cross-connected with the first inverter;
a first transfer transistor connected between the first bus and an input terminal of the first inverter; and
a second transfer transistor connected between the first bus and an input terminal of the second inverter.

14. The semiconductor memory device according to claim 13, wherein
the sense amplifier circuit comprises:
a first transistor set at a conductive state or a non-conductive state based on a state of a sense node to switch a potential of the first bus; and
a second transistor having a gate connected to the first bus, the second transistor being switched between a conductive state and a non-conductive state.

15. The semiconductor memory device according to claim 11, wherein
the plurality of circuit groups are provided between the memory cell array and the second data latch.

16. The semiconductor memory device according to claim 15, wherein
the second data latch is provided between the plurality of circuit groups and the pad.

17. The semiconductor memory device according to claim 11, further comprising a charging transistor, the charging transistor having a first end connected to the first bus and a second end supplied with a power supply voltage, and the charging transistor being rendered conductive according to a control signal, thereby charging the first bus.

* * * * *